(12) United States Patent
Lin et al.

(10) Patent No.: US 10,630,270 B1
(45) Date of Patent: Apr. 21, 2020

(54) DOWN-CONVERSION MIXER

(71) Applicant: National Chi Nan University, Puli, Nantou (TW)

(72) Inventors: Yo-Sheng Lin, Nantou (TW); Kai-Siang Lan, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 0 days.

(21) Appl. No.: 16/459,399

(22) Filed: Jul. 1, 2019

(30) Foreign Application Priority Data

Mar. 22, 2019 (TW) .............................. 108110116 A (51) Int. Cl.
*H04B 1/28* (2006.01)
*H03K 5/1252* (2006.01)
*H03B 5/24* (2006.01)
*H03D 7/12* (2006.01)

(52) U.S. Cl.
CPC ............. *H03K 5/1252* (2013.01); *H03B 5/24* (2013.01); *H03D 7/125* (2013.01)

(58) Field of Classification Search
CPC .. H03D 7/1433; H03D 7/1441; H03D 7/1443; H03D 7/1408; H03D 7/125; H03B 1/28; H03B 5/24; H03K 5/1252
See application file for complete search history.

(56) References Cited

U.S. PATENT DOCUMENTS 10,439,574 B2 * 10/2019 Lin ..................... H03F 3/45183
2019/0207572 A1 * 7/2019 Lin ......................... H03F 3/211

* cited by examiner

*Primary Examiner* — Long Nguyen
(74) *Attorney, Agent, or Firm* — Womble Bond Dickinson (US) LLP (57) ABSTRACT

A down-conversion mixer includes a converting-and-mixing module and a load module. The converting-and-mixing module performs voltage-to-current conversion and mixing with a differential oscillatory voltage signal pair upon a differential input voltage signal pair to generate a differential mixed current signal pair. The load module includes a first transistor, a second transistor and a resistor-inductor (RL) circuit that cooperatively convert the differential mixed current signal pair into a differential mixed voltage signal pair. Each of the first and second transistors has a transconductance that varies according to a control voltage.

13 Claims, 6 Drawing Sheets

DOWN-CONVERSION MIXER

CROSS-REFERENCE TO RELATED APPLICATION

This application claims priority of Taiwanese Patent Application No. 108110116, filed on Mar. 22, 2019.

FIELD

The disclosure relates to a mixer, and more particularly to a down-conversion mixer with a variable conversion gain.

BACKGROUND

Figure 1:
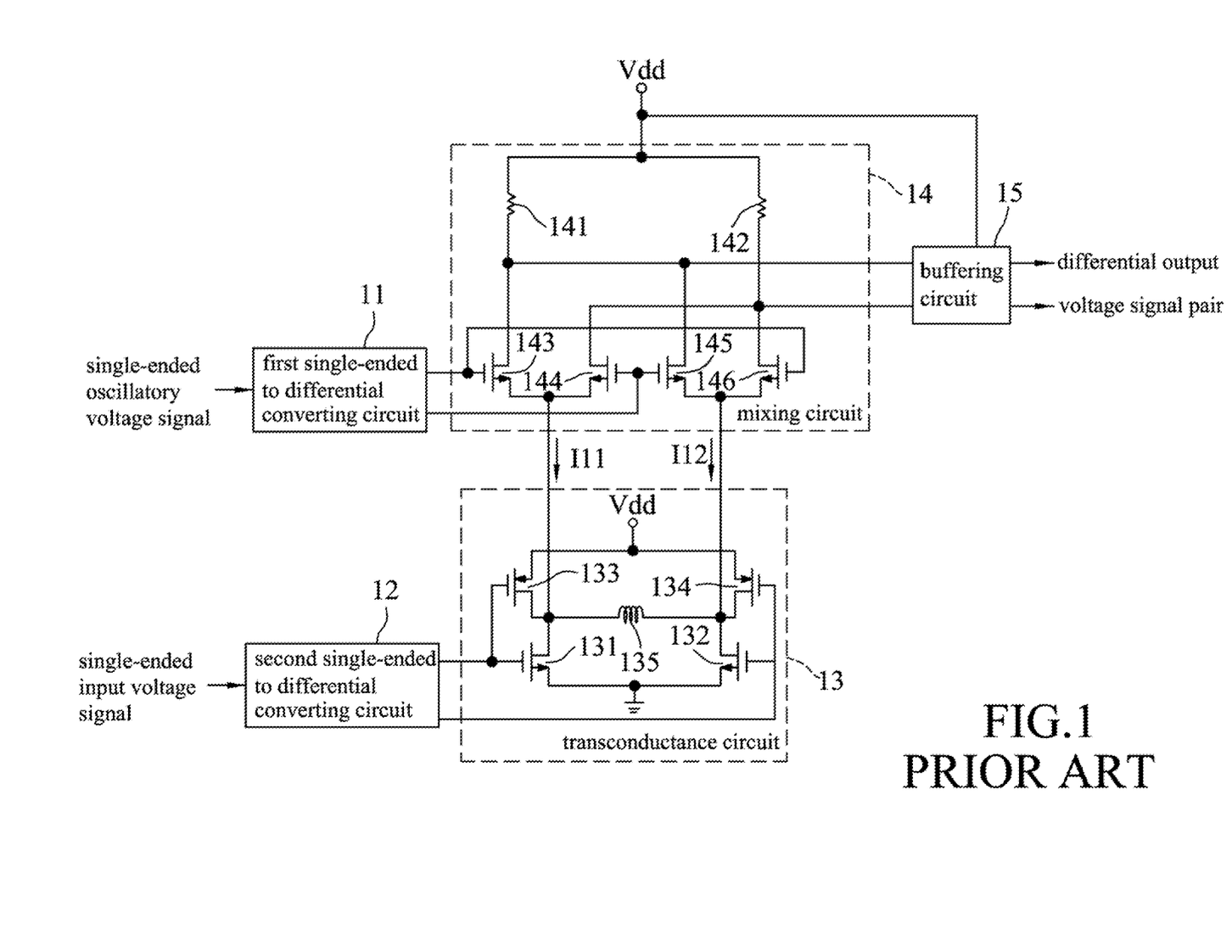
FIG. 1 is a circuit block diagram illustrating a conventional down-conversion mixer.

Referring to FIG. 1, a conventional down-conversion mixer includes a first single-ended to differential converting circuit 11, a second single-ended to differential converting circuit 12, a transconductance circuit 13, a mixing circuit 14 and a buffering circuit 15.

The first single-ended to differential converting circuit 11 converts a single-ended oscillatory voltage signal into a differential oscillatory voltage signal pair. The second single-ended to differential converting circuit 12 converts a single-ended input voltage signal of radio frequency into a differential input voltage signal pair. The transconductance circuit 13 includes four transistors 131-134 and an inductor 135, and converts the differential input voltage signal pair into a differential input current signal pair. The mixing circuit 14 includes two resistors 141, 142 and four transistors 143-146, and mixes the differential input current signal pair with the differential oscillatory voltage signal pair to generate a differential mixed voltage signal pair of intermediate frequency. The buffering circuit 15 buffers the differential mixed voltage signal pair to generate a differential output voltage signal pair.

When a frequency of the differential mixed voltage signal pair is low, a conversion gain (CG) of a combination of the transconductance circuit 13 and the mixing circuit 14 can be expressed by the following equation:

$$CG \approx \frac{2}{\pi} \cdot \mathrm{sinc}(\pi \cdot \Delta / T_{OS}) \cdot (g_{m131,132} + g_{m133,134}) \cdot R_L \qquad \text{Equation 1}$$

where $g_{m131,132}$ denotes a transconductance of each of the transistors 131, 132, $g_{m133,134}$ denotes a transconductance of each of the transistors 133, 134, $R_L$ denotes a resistance of each of the resistors 141, 142, $T_{OS}$ denotes a period of the differential oscillatory voltage signal pair, and $\Delta$ denotes a half of the fraction of the period in which the transistors 143-146 all conduct.

Since all of the parameters in Equation 1 are fixed, both the CG of the combination of the transconductance circuit 13 and the mixing circuit 14 and a CG of the conventional down-conversion mixer are fixed. In addition, the CG of the conventional down-conversion mixer is low, and a noise figure of the conventional down-conversion mixer is high.

SUMMARY

Therefore, an object of the disclosure is to provide a down-conversion mixer with a variable conversion gain.

According to the disclosure, the down-conversion mixer includes a converting-and-mixing module and a load module. The converting-and-mixing module is for receiving a differential input voltage signal pair and a differential oscillatory voltage signal pair, and performs voltage-to-current conversion and mixing with the differential oscillatory voltage signal pair upon the differential input voltage signal pair to generate a differential mixed current signal pair that includes a first mixed current signal and a second mixed current signal. The load module is coupled to the converting-and-mixing module for receiving the differential mixed current signal pair therefrom, and converts the differential mixed current signal pair into a differential mixed voltage signal pair that includes a first mixed voltage signal and a second mixed voltage signal. The load module includes a first transistor, a second transistor and a resistor-inductor (RL) circuit. Each of the first and second transistors has a first terminal that is for receiving a reference voltage, a second terminal that is coupled to the converting-and-mixing module, a control terminal that is for receiving a control voltage, and a transconductance that varies according to the control voltage. The RL circuit is coupled between the second terminals of the first and second transistors, cooperates with the first transistor to receive the first mixed current signal from the converting-and-mixing module, and cooperates with the second transistor to receive the second mixed current signal from the converting-and-mixing module. The first mixed voltage signal is provided at the second terminal of the first transistor. The second mixed voltage signal is provided at the second terminal of the second transistor.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that throughout the disclosure, each current signal may have a positive magnitude or a negative magnitude, with the positive and negative magnitudes indicating opposite directions of the current signal. For example, when a component receives a current signal with the positive magnitude, the current signal flows into the component; and when the component receives the current signal with the negative magnitude, the current signal flows out of the component. Moreover, it should be noted that throughout the drawings, the direction of each current signal is shown by a corresponding arrow.

Figure 2:
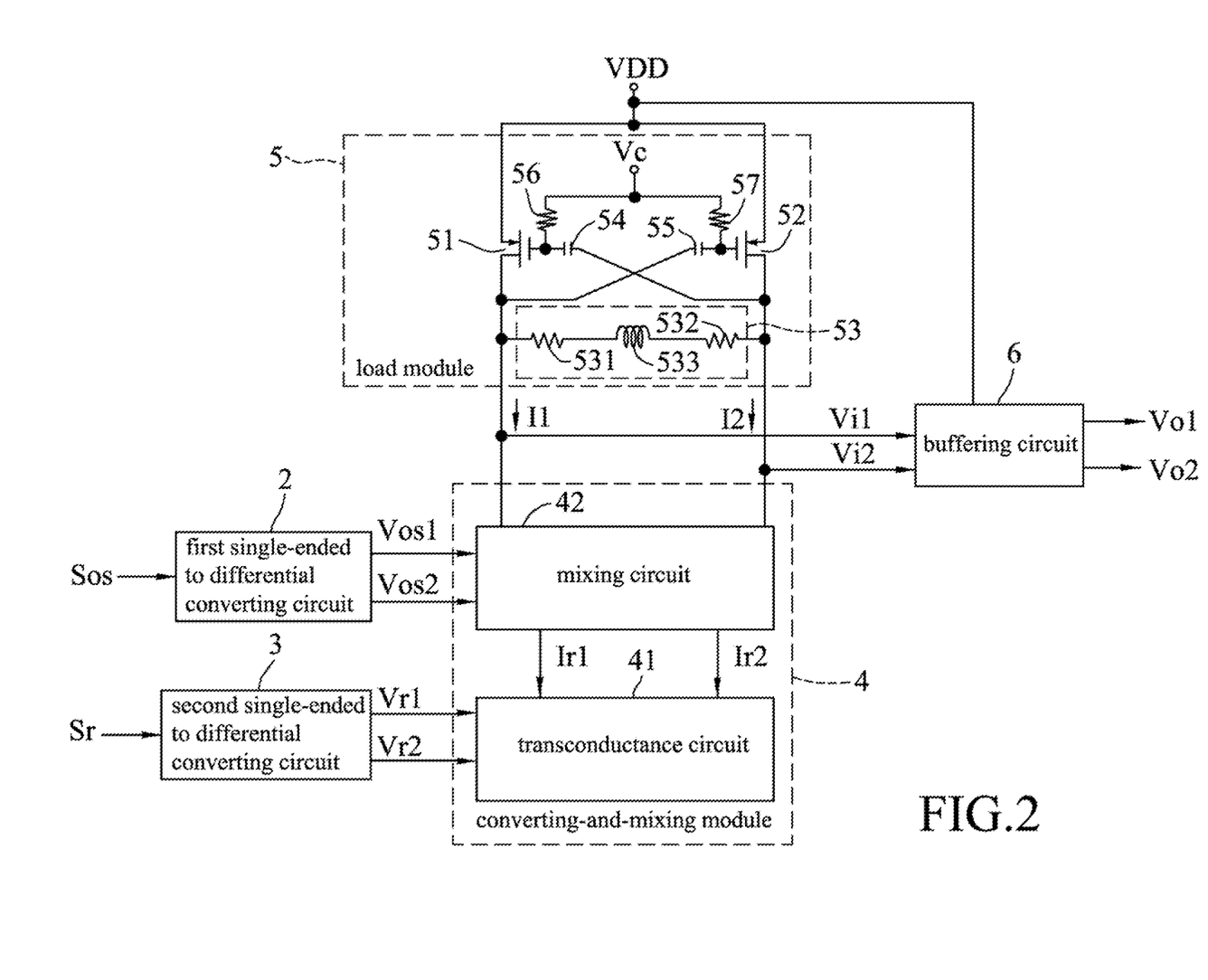
FIGS. 2 and 3 are circuit block diagrams illustrating an embodiment of a down-conversion mixer according to the disclosure.
Figure 3:
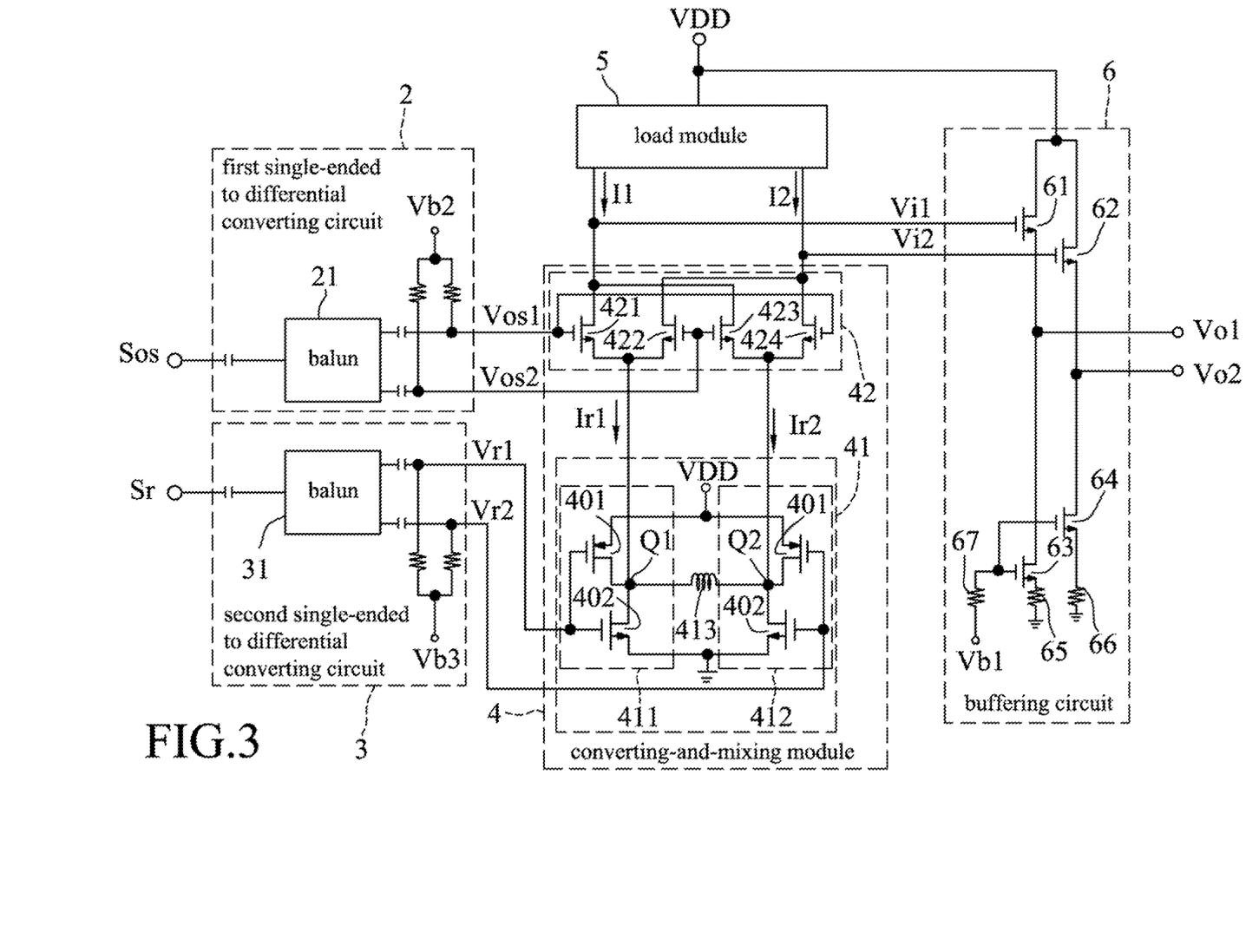

Referring to FIGS. 2 and 3, an embodiment of a down-conversion mixer according to the disclosure includes a first single-ended to differential converting circuit 2, a second single-ended to differential converting circuit 3, a converting-and-mixing module 4, a load module 5 and a buffering circuit 6.

The first single-ended to differential converting circuit 2 is for receiving a single-ended oscillatory voltage signal (Sos), and converts the single-ended oscillatory voltage signal (Sos) into a differential oscillatory voltage signal pair that includes a first oscillatory voltage signal (Vos1) and a second oscillatory voltage signal (Vos2).

The second single-ended to differential converting circuit 3 is for receiving a single-ended input voltage signal (Sr) of, for example, radio frequency, and converts the single-ended input voltage signal (Sr) into a differential input voltage signal pair that includes a first input voltage signal (Vr1) and a second input voltage signal (Vr2).

The converting-and-mixing module 4 is coupled to the first and second single-ended to differential converting circuits 2, 3 for receiving the differential oscillatory voltage signal pair and the differential input voltage signal pair respectively therefrom. The converting-and-mixing module 4 performs voltage-to-current conversion and mixing with the differential oscillatory voltage signal pair upon the differential input voltage signal pair to generate a differential mixed current signal pair that includes a first mixed current signal (I1) and a second mixed current signal (I2) and that is of, for example, intermediate frequency.

The load module 5 is coupled to the converting-and-mixing module 4 for receiving the differential mixed current signal pair therefrom, and converts the differential mixed current signal pair into a differential mixed voltage signal pair that includes a first mixed voltage signal (Vi1) and a second mixed voltage signal (Vi2).

The buffering circuit 6 is coupled to the load module 5 for receiving the differential mixed voltage signal pair therefrom, and buffers the differential mixed voltage signal pair to generate a differential output voltage signal pair that includes a first output voltage signal (Vo1) and a second output voltage signal (Vo2).

In an example where the single-ended input voltage signal (Sr) has a frequency of 94 GHz, and where the single-ended oscillatory voltage signal (Sos) has a frequency of 93.9 GHz, the differential output voltage signal pair has a frequency of 0.1 GHz.

In this embodiment, as shown in FIG. 3, the first single-ended to differential converting circuit 2 includes a balun 21 (e.g., a Marchand balun or an elliptical balun) and other elements. The balun 21 has an input terminal that is for receiving a voltage signal related to the single-ended oscillatory voltage signal (Sos), a first output terminal that provides a voltage signal related to the first oscillatory voltage signal (Vos1), and a second output terminal that provides a voltage signal related to the second oscillatory voltage signal (Vos2). Similarly, the second single-ended to differential converting circuit 3 includes a balun 31 (e.g., a Marchand balun or an elliptical balun) and other elements. The balun 31 has an input terminal that is for receiving a voltage signal related to the single-ended input voltage signal (Sr), a first output terminal that provides a voltage signal related to the first input voltage signal (Vr1), and a second output terminal that provides a voltage signal related to the second input voltage signal (Vr2).

In this embodiment, the converting-and-mixing module 4 includes a transconductance circuit 41 and a mixing circuit 42. The transconductance circuit 41 is coupled to the second single-ended to differential converting circuit 3 for receiving the differential input voltage signal pair therefrom, and converts the differential input voltage signal pair into a differential input current signal pair that includes a first input current signal (Ir1) and a second input current signal (Ir2). The mixing circuit 42 is coupled to the first single-ended to differential converting circuit 2 and the transconductance circuit 41 for receiving the differential oscillatory voltage signal pair and the differential input current signal pair respectively therefrom. The mixing circuit 42 mixes the differential input current signal pair with the differential oscillatory voltage signal pair to generate the differential mixed current signal pair.

In this embodiment, as shown in FIG. 3, the transconductance circuit 41 includes a first transconductance unit 411, a second transconductance unit 412 and an inductor 413. The first transconductance unit 411 is coupled to the second single-ended to differential converting circuit 3 for receiving the first input voltage signal (Vr1) therefrom, and converts the first input voltage signal (Vr1) into the first input current signal (Ir1). Likewise, the second transconductance unit 412 is coupled to the second single-ended to differential converting circuit 3 for receiving the second input voltage signal (Vr2) therefrom, and converts the second input voltage signal (Vr2) into the second input current signal (Ir2). The inductor 413 is coupled between the first and second transconductance units 411, 412. In particular, the first input current signal (Ir1) is in-phase with the first input voltage signal (Vr1), the second input current signal (Tr2) is in-phase with the second input voltage signal (Vr2), and each of the first and second transconductance units 411, 412 includes two transistors 401, 402. For each of the first and second transconductance units 411, 412, the transistor 401 has a first terminal that is for receiving a first reference voltage (e.g., a supply voltage (VDD)), a second terminal that is coupled to the inductor 413, and a control terminal that is coupled to the second single-ended to differential converting circuit 3 for receiving a corresponding one of the first and second input voltage signals (Vr1, Vr2) therefrom; the transistor 402 has a first terminal that is coupled to the second terminal of the transistor 401, a second terminal that is for receiving a second reference voltage (e.g., a ground voltage), and a control terminal that is coupled to the control terminal of the transistor 401; and the transistor 402 cooperates with the transistor 401 to provide a corresponding one of the first and second input current signals (Ir1, Ir2) at a common node (Q1/Q2) of the transistors 401, 402 and the inductor 413.

In this embodiment, as shown in FIG. 3, the mixing circuit 42 includes four transistors 421-424. The transistor 421 has a first terminal, a second terminal that is coupled to the common node (Q1), and a control terminal that is coupled to the first single-ended to differential converting circuit 2 for receiving the first oscillatory voltage signal (Vos1) therefrom. The transistor 422 has a first terminal, a second terminal that is coupled to the second terminal of the transistor 421, and a control terminal that is coupled to the first single-ended to differential converting circuit 2 for receiving the second oscillatory voltage signal (Vos2) therefrom. The transistor 422 cooperates with the transistor 421 to receive the first input current signal (Ir1) from the first transconductance unit 411. The transistor 423 has a first terminal that is coupled to the first terminal of the transistor 421, a second terminal that is coupled to the common node (Q2), and a control terminal that is coupled to the control terminal of the transistor 422. The transistor 423 cooperates with the transistor 421 to provide the first mixed current signal (I1) at the first terminal of the transistor 421. The transistor 424 has a first terminal that is coupled to the first terminal of the transistor 422, a second terminal that is coupled to the second terminal of the transistor 423, and a control terminal that is coupled to the control terminal of the transistor 421. The transistor 424 cooperates with the transistor 423 to receive the second input current signal (Ir2) from the second transconductance unit 412, and cooperates with the transistor 422 to provide the second mixed current signal (I2) at the first terminal of the transistor 422.

In this embodiment, as shown in FIG. 2, the load module 5 includes two transistors 51, 52, a resistor-inductor (RL) circuit 53, two capacitors 54, 55 and two resistors 56, 57. Each of the resistors 56, 57 has a first terminal that is for receiving a control voltage (Vc), and a second terminal. Each of the transistors 51, 52 has a first terminal that is for receiving the first reference voltage (i.e., the supply voltage (VDD)), a second terminal that is coupled to the first terminal of the transistor 421, a control terminal that is coupled to the second terminal of a respective one of the resistors 56, 57 for receiving the control voltage (Vc) therethrough, and a transconductance that varies according to the control voltage (Vc). The capacitor 54 is coupled between the control terminal of the transistor 51 and the second terminal of the transistor 52. The capacitor 55 is coupled between the control terminal of the transistor 52 and the second terminal of the transistor 51. The RL circuit 53 is coupled between the second terminals of the transistors 51, 52, cooperates with the transistor 51 to receive the first mixed current signal (I1) from the mixing circuit 42, and cooperates with the transistor 52 to receive the second mixed current signal (I2) from the mixing circuit 42. In an implementation, the RL circuit 53 includes two resistors 531, 532 and an inductor 533 that are coupled in series between the second terminals of the transistors 51, 52, with the inductor 533 coupled between the resistors 531, 532; and each of the resistors 531, 532 has a fixed resistance. The first mixed voltage signal (Vi1) is provided at the second terminal of the transistor 51. The second mixed voltage signal (Vi2) is provided at the second terminal of the transistor 52.

In this embodiment, as shown in FIG. 3, the buffering circuit 6 includes four transistors 61-64 and three resistors 65-67. The transistor 61 has a first terminal that is for receiving the first reference voltage (i.e., the supply voltage (VDD)), a second terminal, and a control terminal that is coupled to the second terminal of the transistor 51 for receiving the first mixed voltage signal (Vi1) therefrom. The transistor 62 has a first terminal that is coupled to the first terminal of the transistor 61, a second terminal, and a control terminal that is coupled to the second terminal of the transistor 52 for receiving the second mixed voltage signal (Vi2) therefrom. The resistor 67 has a first terminal that is for receiving a bias voltage (Vb1), and a second terminal. The transistor 63 has a first terminal that is coupled to the second terminal of the transistor 61, a second terminal, and a control terminal that is coupled to the second terminal of the resistor 67 for receiving the bias voltage (Vb1) therethrough. The transistor 64 has a first terminal that is coupled to the second terminal of the transistor 62, a second terminal, and a control terminal that is coupled to the control terminal of the transistor 63. The resistor 65 has a first terminal that is coupled to the second terminal of the transistor 63, and a second terminal that is for receiving the second reference voltage (i.e., the ground voltage). The resistor 66 is coupled between the second terminal of the transistor 64 and the second terminal of the resistor 65. The first output voltage signal (Vo1) is provided at the second terminal of the transistor 61. The second output voltage signal (Vo2) is provided at the second terminal of the transistor 62.

In this embodiment, each of the transistors 402, 421-424, 61-64 is an N-type metal oxide semiconductor field effect transistor (nMOSFET) having a drain terminal, a source terminal and a gate terminal that respectively serve as the first, second and control terminals of the transistor; and each of the transistors 401, 51, 52 is a P-type metal oxide semiconductor field effect transistor (pMOSFET) having a source terminal, a drain terminal and a gate terminal that respectively serve as the first, second and control terminals of the transistor.

In this embodiment, when a frequency of the differential mixed current signal pair is low (e.g., within a range of 0 Hz to 0.1 GHz), a conversion gain (CG) of a combination of the converting-and-mixing module 4 and the load module 5 can be expressed by the following equation:

$$CG \approx \frac{2}{\pi} \cdot \text{sinc}(\pi \cdot \Delta / T_{OS}) \cdot (g_{m402} + g_{m401}) \cdot \frac{R_{531,532}}{1 - g_{m51,52} \cdot R_{531,532}}$$

where $g_{m402}$ denotes a transconductance of the transistor 402 of each of the first and second transconductance units 411, 412, $g_{m401}$ denotes a transconductance of the transistor 401 of each of the first and second transconductance units 411, 412, $g_{m51,52}$ denotes the transconductance of each of the transistors 51, 52, $R_{531,532}$ denotes the resistance of each of the resistors 531, 532, $T_{OS}$ denotes a period of the differential oscillatory voltage signal pair, and $\Delta$ denotes a half of the fraction of the period in which the transistors 421-424 all conduct. In an example, $\Delta/T_{OS}$ is 0.0885, and $\text{sinc}(\pi \cdot \Delta/T_{OS})$ is 0.987.

In this embodiment, since the transconductance ($g_{m51,52}$) of each of the transistors 51, 52 varies according to the control voltage (Vc), one can decrease the control voltage (Vc) to increase the transconductance ($g_{m51,52}$) of each of the transistors 51, 52, thereby increasing the conversion gain (CG) of the combination of the converting-and-mixing module 4 and the load module 5, and thus increasing a conversion gain of the down-conversion mixer and reducing a noise figure of the down-conversion mixer. In addition, the inductor 413 resonates with the parasitic capacitances of the transistors 401, 402, 421-424 to compensate a frequency pole generated due to the parasitic capacitances of the transistors 401, 402, 421-424, thereby increasing the conversion gain (CG) of the combination of the converting-and-mixing module 4 and the load module 5, and thus increasing the conversion gain of the down-conversion mixer and reducing the noise figure of the down-conversion mixer.

Figure 4:
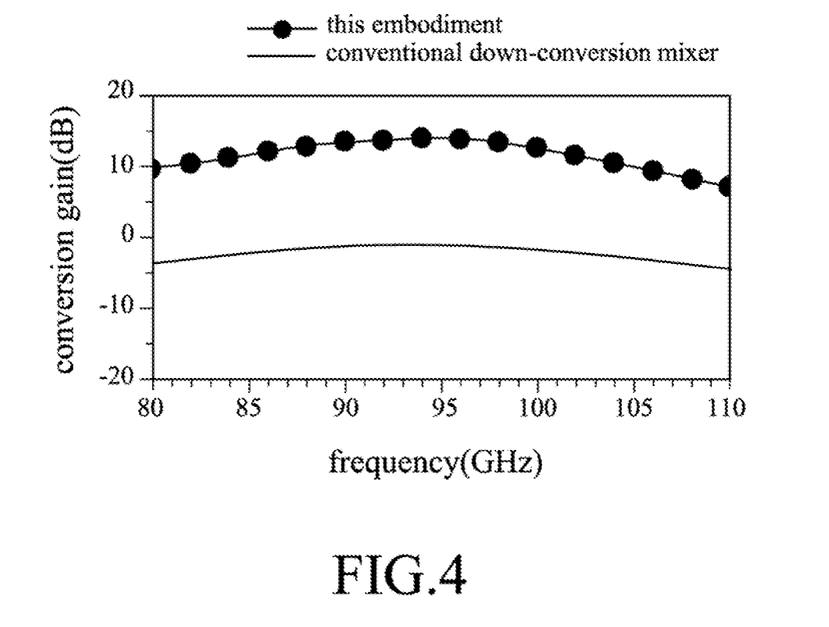
FIG. 4 is a plot illustrating conversion gain versus frequency characteristic for the embodiment and the conventional down-conversion mixer.

FIG. 4 illustrates simulated conversion gain of the down-conversion mixer of this embodiment and simulated conversion gain of the conventional down-conversion mixer under a circumstance where the frequency of the single-ended input voltage signal (Sr) (see FIG. 2) is within a range of 80 GHz to 110 GHz, and where the frequency of the single-ended oscillatory voltage signal (Sos) (see FIG. 2) is lower than that of the single-ended input voltage signal (Sr) (see FIG. 2) by 0.1 GHz. It can be reasonably determined from FIG. 4 that the conversion gain of the down-conversion mixer of this embodiment is higher than that of the conventional down-conversion mixer.

Figure 5:
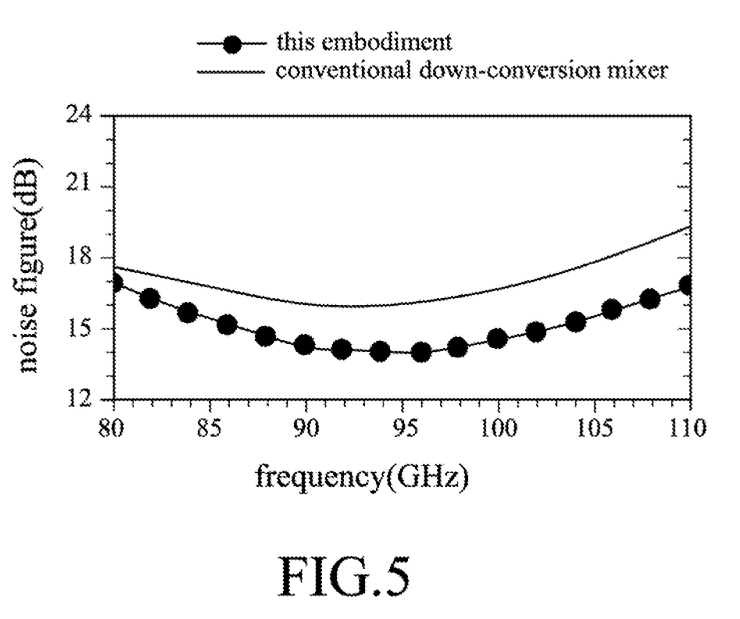
FIG. 5 is a plot illustrating noise figure versus frequency characteristic for the embodiment and the conventional down-conversion mixer.

FIG. 5 illustrates simulated noise figure of the down-conversion mixer of this embodiment and simulated noise figure of the conventional down-conversion mixer under the aforesaid circumstance. It can be reasonably determined from FIG. 5 that the noise figure of the down-conversion mixer of this embodiment is lower than that of the conventional down-conversion mixer.

Figure 6:
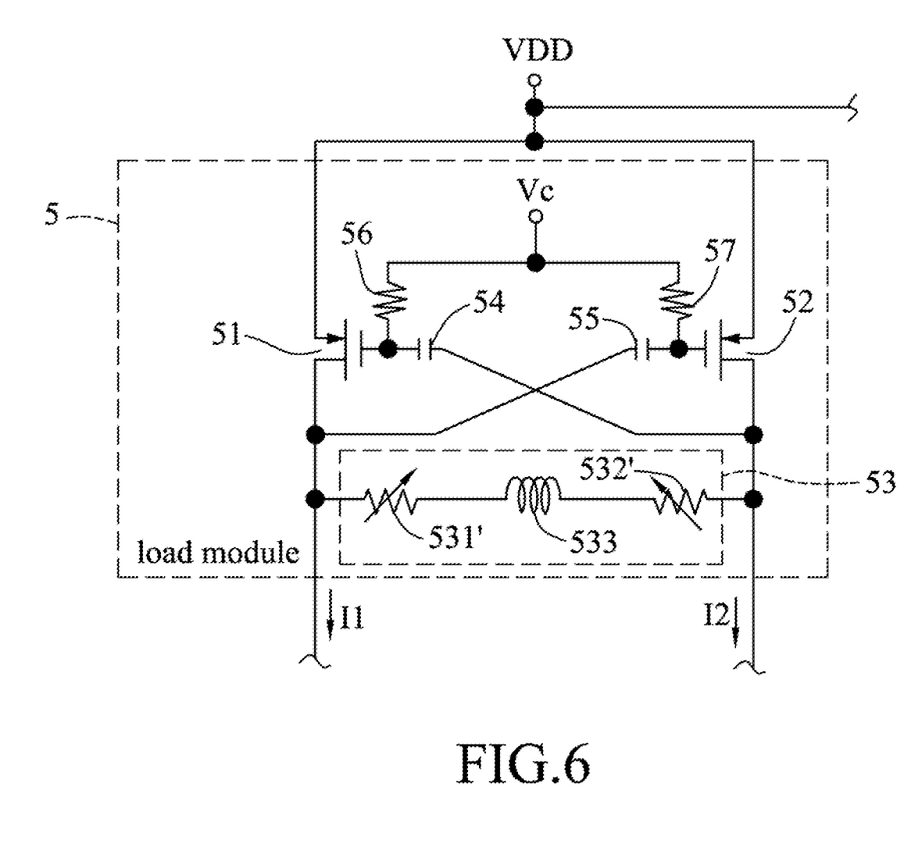
FIG. 6 is a circuit diagram illustrating another implementation of a load module of the embodiment.

FIG. 6 illustrates another implementation of the load module 5, in which the resistance ($R_{531,532}$) of each of the resistors 531', 532' is variable, instead of being fixed. As a result, one can increase the resistance ($R_{531,532}$) of each of the resistors 531', 532' to increase the conversion gain (CG) of the combination of the converting-and-mixing module 4 and the load module 5, thereby increasing the conversion gain of the down-conversion mixer and reducing the noise figure of the down-conversion mixer.

Referring back to FIGS. 2, 3 and 6, in view of the above, in this embodiment, since the conversion gain and the noise figure of the down-conversion mixer varies according to the control voltage (Vc) and, optionally, the resistance of each of the resistors 531', 532', one can adjust the control voltage (Vc) and, optionally, the resistance of each of the resistors 531', 532' to change the conversion gain and the noise figure of the down-conversion mixer.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A down-conversion mixer comprising:
    a converting-and-mixing module for receiving a differential input voltage signal pair and a differential oscillatory voltage signal pair, and performing voltage-to-current conversion and mixing with the differential oscillatory voltage signal pair upon the differential input voltage signal pair to generate a differential mixed current signal pair that includes a first mixed current signal and a second mixed current signal; and
    a load module coupled to said converting-and-mixing module for receiving the differential mixed current signal pair therefrom, and converting the differential mixed current signal pair into a differential mixed voltage signal pair that includes a first mixed voltage signal and a second mixed voltage signal, said load module including
        a first transistor and a second transistor, each having a first terminal that is for receiving a first reference voltage, a second terminal that is coupled to said converting-and-mixing module, a control terminal that is for receiving a control voltage, and a transconductance that varies according to the control voltage, and
        a resistor-inductor (RL) circuit coupled between said second terminals of said first and second transistors, cooperating with said first transistor to receive the first mixed current signal from said converting-and-mixing module, and cooperating with said second transistor to receive the second mixed current signal from said converting-and-mixing module,
        the first mixed voltage signal being provided at said second terminal of said first transistor,
        the second mixed voltage signal being provided at said second terminal of said second transistor.

2. The down-conversion mixer of claim 1, wherein said load module further includes:
    a first capacitor coupled between said control terminal of said first transistor and said second terminal of said second transistor;
    a second capacitor coupled between said control terminal of said second transistor and said second terminal of said first transistor; and
    two resistors, each having a first terminal that is for receiving the control voltage, and a second terminal that is coupled to said control terminal of a respective one of said first and second transistors.

3. The down-conversion mixer of claim 1, wherein said RL circuit includes two resistors and an inductor that are coupled in series between said second terminals of said first and second transistors, with said inductor coupled between said resistors.

4. The down-conversion mixer of claim 3, wherein each of said resistors has a variable resistance.

5. The down-conversion mixer of claim 1, wherein said converting-and-mixing module includes:
    a transconductance circuit for receiving the differential input voltage signal pair, and converting the differential input voltage signal pair into a differential input current signal pair; and
    a mixing circuit for receiving the differential oscillatory voltage signal pair, coupled to said transconductance circuit for receiving the differential input current signal pair therefrom, and coupled further to said second terminals of said first and second transistors of said load module, said mixing circuit mixing the differential input current signal pair with the differential oscillatory voltage signal pair to generate the differential mixed current signal pair for receipt by said load module.

6. The down-conversion mixer of claim 5, wherein:
    the differential input voltage signal pair includes a first input voltage signal and a second input voltage signal;
    the differential input current signal pair includes a first input current signal and a second input current signal;
    said transconductance circuit includes
        a first transconductance unit for receiving the first input voltage signal, and converting the first input voltage signal into the first input current signal,
        a second transconductance unit for receiving the second input voltage signal, and converting the second input voltage signal into the second input current signal, and
        an inductor coupled between said first and second transconductance units; and
    said mixing circuit is coupled to a common node of said first transconductance unit and said inductor and to a common node of said second transconductance unit and said inductor for receiving the differential input current signal pair therefrom.

7. The down-conversion mixer of claim 6, wherein the first input current signal is in-phase with the first input voltage signal, and the second input current signal is in-phase with the second input voltage signal.

8. The down-conversion mixer of claim 7, wherein one of said first and second transconductance units includes:
- a third transistor having a first terminal that is for receiving the first reference voltage, a second terminal that is coupled to said inductor and said mixing circuit, and a control terminal that is for receiving a corresponding one of the first and second input voltage signals; and
- a fourth transistor having a first terminal that is coupled to said second terminal of said third transistor, a second terminal that is for receiving a second reference voltage, and a control terminal that is coupled to said control terminal of said third transistor, said fourth transistor cooperating with said third transistor to provide a corresponding one of the first and second input current signals for receipt by said mixing circuit.

9. The down-conversion mixer of claim 5, wherein:
the differential oscillatory voltage signal pair includes a first oscillatory voltage signal and a second oscillatory voltage signal;
the differential input current signal pair includes a first input current signal and a second input current signal; and
said mixing circuit includes
- a third transistor having a first terminal that is coupled to said second terminal of said first transistor of said load module, a second terminal that is coupled to said transconductance circuit, and a control terminal that is for receiving the first oscillatory voltage signal,
- a fourth transistor having a first terminal that is coupled to said second terminal of said second transistor of said load module, a second terminal that is coupled to said second terminal of said third transistor, and a control terminal that is for receiving the second oscillatory voltage signal, said fourth transistor cooperating with said third transistor to receive the first input current signal from said transconductance circuit,
- a fifth transistor having a first terminal that is coupled to said first terminal of said third transistor, a second terminal that is coupled to said transconductance circuit, and a control terminal that is coupled to said control terminal of said fourth transistor, said fifth transistor cooperating with said third transistor to provide the first mixed current signal for receipt by said load module, and
- a sixth transistor having a first terminal that is coupled to said first terminal of said fourth transistor, a second terminal that is coupled to said second terminal of said fifth transistor, and a control terminal that is coupled to said control terminal of said third transistor, said sixth transistor cooperating with said fifth transistor to receive the second input current signal from said transconductance circuit, and cooperating with said fourth transistor to provide the second mixed current signal for receipt by said load module.

10. The down-conversion mixer of claim 1, further comprising a buffering circuit that is coupled to said second terminals of said first and second transistors for receiving the differential mixed voltage signal pair therefrom, and that buffers the differential mixed voltage signal pair to generate a differential output voltage signal pair.

11. The down-conversion mixer of claim 10, wherein:
the differential output voltage signal pair includes a first output voltage signal and a second output voltage signal;
said buffering circuit includes
- a third transistor having a first terminal that is for receiving the first reference voltage, a second terminal, and a control terminal that is coupled to said second terminal of said first transistor for receiving the first mixed voltage signal therefrom,
- a fourth transistor having a first terminal that is coupled to said first terminal of said third transistor, a second terminal, and a control terminal that is coupled to said second terminal of said second transistor for receiving the second mixed voltage signal therefrom,
- a fifth transistor having a first terminal that is coupled to said second terminal of said third transistor, a second terminal, and a control terminal that is for receiving a bias voltage,
- a sixth transistor having a first terminal that is coupled to said second terminal of said fourth transistor, a second terminal, and a control terminal that is coupled to said control terminal of said fifth transistor,
- a first resistor having a first terminal that is coupled to said second terminal of said fifth transistor, and a second terminal that is for receiving a second reference voltage, and
- a second resistor coupled between said second terminal of said sixth transistor and said second terminal of said first resistor,
the first output voltage signal being provided at said second terminal of said third transistor,
the second output voltage signal being provided at said second terminal of said fourth transistor.

12. The down-conversion mixer of claim 1, further comprising a single-ended to differential converting circuit that is coupled to said converting-and-mixing module, that is for receiving a single-ended oscillatory voltage signal, and that converts the single-ended oscillatory voltage signal into the differential oscillatory voltage signal pair for receipt by said converting-and-mixing module.

13. The down-conversion mixer of claim 1, further comprising a single-ended to differential converting circuit that is coupled to said converting-and-mixing module, that is for receiving a single-ended input voltage signal, and that converts the single-ended input voltage signal into the differential input voltage signal pair for receipt by said converting-and-mixing module.

* * * * *